United States Patent
Shepard

(10) Patent No.: US 9,997,564 B2
(45) Date of Patent: Jun. 12, 2018

(54) MTJ MEMORY ARRAY SUBGROUPING METHOD AND RELATED DRIVE CIRCUITRY

(71) Applicant: Western Digital Technologies, Inc., Irvine, CA (US)

(72) Inventor: Daniel R. Shepard, North Hampton, NH (US)

(73) Assignee: Western Digital Technologies, Inc., San Jose, CA (US)

( * ) Notice: Subject to any disclaimer, the term of this patent is extended or adjusted under 35 U.S.C. 154(b) by 0 days. days.

(21) Appl. No.: 14/879,313

(22) Filed: Oct. 9, 2015

(65) Prior Publication Data
US 2017/0104028 A1 Apr. 13, 2017

(51) Int. Cl.
| | | |
|---|---|---|
| *H01L 27/22* | (2006.01) | |
| *H01L 43/10* | (2006.01) | |
| *H01L 43/06* | (2006.01) | |
| *H01L 43/04* | (2006.01) | |
| *H01L 27/24* | (2006.01) | |
| *G11C 11/16* | (2006.01) | |
| *H01L 27/10* | (2006.01) | |

(52) U.S. Cl.
CPC ........ *H01L 27/228* (2013.01); *G11C 11/1659* (2013.01); *H01L 27/10* (2013.01); *H01L 27/2463* (2013.01); *H01L 43/04* (2013.01); *H01L 43/06* (2013.01); *H01L 43/10* (2013.01)

(58) Field of Classification Search
CPC . H01L 27/222; H01L 27/2463; H01L 27/224; H01L 27/10; H01L 27/1052; H01L 27/226–27/228; H01L 27/2436–27/2445; H01L 27/2454–27/2481; G11C 11/1659
See application file for complete search history.

(56) References Cited

U.S. PATENT DOCUMENTS

| | | |
|---|---|---|
| 6,972,989 B2 | 12/2005 | Lammers |
| 7,170,783 B2 | 1/2007 | Ha et al. |
| 7,224,628 B2 | 5/2007 | Yang et al. |
| 7,283,417 B2 | 10/2007 | Davis et al. |
| 7,679,122 B2 | 3/2010 | Lee |
| 8,000,156 B2 | 8/2011 | Van Winkelhoff et al. |

(Continued)

OTHER PUBLICATIONS

Dong, et al.; Circuit and Microarchitecture Evaluation of 3D Stacking Magnetic RAM (MRAM) as a Universal Memory Replacement dated 2008; 6 total pages.

*Primary Examiner* — Daniel Luke
(74) *Attorney, Agent, or Firm* — Stoel Rives LLP

(57) ABSTRACT

Embodiments of the present disclosure generally relate to data storage systems, and more particularly, to a SHE-MRAM device. The SHE-MRAM device includes a memory cell array having a plurality of first leads, a plurality of second leads, and a plurality of memory cells disposed between the plurality of first leads and the plurality of second leads. The second leads are made of a material having large spin orbit interactions and high electrical resistivity. The SHE-MRAM device further includes a periphery circuitry having multiple pairs of transistors. The multiple pairs of transistors reduce the length a current has to flow through a second lead of the plurality of second leads. By limiting the distance a current can flow through the second lead, applying excessive voltage to the second lead is avoided.

24 Claims, 4 Drawing Sheets

(56) References Cited

U.S. PATENT DOCUMENTS

| | | |
|---|---|---|
| 9,076,541 B2 | 7/2015 | Ong et al. |
| 2008/0232169 A1* | 9/2008 | Frulio ................... G11C 5/025 365/185.17 |
| 2014/0269035 A1 | 9/2014 | Manipatruni et al. |
| 2015/0200003 A1* | 7/2015 | Buhrman ................ G11C 11/18 365/158 |
| 2015/0357376 A1* | 12/2015 | Seo ....................... H01L 27/228 257/252 |
| 2016/0064650 A1* | 3/2016 | Wang ................... H01L 27/228 257/427 |

* cited by examiner

MTJ MEMORY ARRAY SUBGROUPING METHOD AND RELATED DRIVE CIRCUITRY

BACKGROUND OF THE DISCLOSURE

Field of the Disclosure

Embodiments of the present disclosure generally relate to a non-volatile memory, particularly Spin Hall Effect magnetoresistive random access memory (SHE-MRAM).

Description of the Related Art

The heart of a computer is a magnetic recording device which typically may include a rotating magnetic media or a solid state media device. A number of different memory technologies exist today for storing information for use in a computing system. These different memory technologies may, in general, be split into two major categories: volatile memory and non-volatile memory. Volatile memory may generally refer to types of computer memory that require power to retain stored data. Non-volatile memory, on the other hand, may generally refer to types of computer memory that do not require power in order to retain stored data.

Recently, a number of emerging technologies have drawn increasing attention as potential contenders for next generation memory. One such memory technology is magnetoresistive random access memory (MRAM). MRAM offers fast access time, infinite read/write endurance, radiation hardness, and high storage density. Unlike conventional RAM chip technologies, MRAM data is not stored as an electric charge, but instead stores data bits using magnetic moments. One type of MRAM is Spin Hall Effect MRAM (SHE-MRAM). SHE-MRAMs devices contain memory elements formed from two magnetically polarized layers, each of which can maintain a magnetic polarization field, separated by a thin insulating layer, which together form a magnetic tunnel junction (MTJ) stack. A layer having large spin orbit interactions may be in contact with the MTJ stack, and Spin Hall Effect is used to switch the MTJ stack as a current flows through the layer. Because the layer having large spin orbit interactions has high electrical resistivity and is very thin, typically in 10 s or 100 s of Angstroms, large voltage is required for driving sufficient current through the layer.

Therefore, there is a need in the art for an improved SHE-MRAM device.

SUMMARY

Embodiments of the present disclosure generally relate to data storage systems, and more particularly, to a SHE-MRAM device. The SHE-MRAM device includes a memory cell array having a plurality of first leads, a plurality of second leads, and a plurality of memory cells disposed between the plurality of first leads and the plurality of second leads. The second leads are made of a material having large spin orbit interactions and high electrical resistivity. The SHE-MRAM device further includes a periphery circuitry having multiple pairs of transistors. The multiple pairs of transistors reduce the length a current has to flow through a second lead of the plurality of second leads. By limiting the distance a current can flow through the second lead, applying excessive voltage to the second lead is avoided.

In one embodiment, a memory cell array includes a plurality of first leads, a plurality of second leads, a plurality of memory cells disposed between the plurality of first leads and the plurality of second leads, and at least two columns of transistors. The at least two columns of transistors divide the plurality of memory cells into one or more column groups of memory cells.

In another embodiment, a SHE-MRAM device includes a memory cell array. The memory cell array includes a plurality of first leads, a plurality of second leads, and a plurality of memory cells disposed between the plurality of first leads and the plurality of second leads. The SHE-MRAM further includes a periphery circuitry coupled with the memory cell array. The periphery circuitry includes multiple pairs of transistors.

In another embodiment, a SHE-MRAM device includes a memory cell array. The memory cell array includes a plurality of first leads, a plurality of second leads, a plurality of memory cells disposed between the plurality of first leads and the plurality of second leads, and at least two columns of transistors. The at least two columns of transistors divide the plurality of memory cells into one or more column groups of memory cells. The SHE-MRAM further includes at least two pairs of transistors. Each pair of transistors of the at least two pairs of transistors is coupled with a column of transistors of the at least two columns of transistors.

In another embodiment, a SHE-MRAM device includes a memory cell array. The memory cell array includes a plurality of memory cells and at least two columns of transistors. The at least two columns of transistors divide the plurality of memory cells into one or more column groups of memory cells. The SHE-MRAM further includes at least two pairs of transistors. Each pair of transistors includes a top transistor and a bottom transistor. The bottom transistor is grounded.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

To facilitate understanding, identical reference numerals have been used, where possible, to designate identical elements that are common to the figures. It is contemplated that elements disclosed in one embodiment may be beneficially utilized on other embodiments without specific recitation.

DETAILED DESCRIPTION

In the following, reference is made to embodiments of the disclosure. However, it should be understood that the disclosure is not limited to specific described embodiments. Instead, any combination of the following features and elements, whether related to different embodiments or not, is contemplated to implement and practice the disclosure. Furthermore, although embodiments of the disclosure may achieve advantages over other possible solutions and/or over the prior art, whether or not a particular advantage is achieved by a given embodiment is not limiting of the disclosure. Thus, the following aspects, features, embodiments and advantages are merely illustrative and are not considered elements or limitations of the appended claims except where explicitly recited in a claim(s). Likewise, reference to "the disclosure" shall not be construed as a generalization of any inventive subject matter disclosed herein and shall not be considered to be an element or limitation of the appended claims except where explicitly recited in a claim(s).

Embodiments of the present disclosure generally relate to data storage systems, and more particularly, to a SHE-MRAM device. The SHE-MRAM device includes a memory cell array having a plurality of first leads, a plurality of second leads, and a plurality of memory cells disposed between the plurality of first leads and the plurality of second leads. The second leads are made of a material having large spin orbit interactions and high electrical resistivity. The SHE-MRAM device further includes a periphery circuitry having multiple pairs of transistors. The multiple pairs of transistors reduce the length a current has to flow through a second lead of the plurality of second leads. By limiting the distance a current can flow through the second lead, applying excessive voltage to the second lead is avoided.

Figure 1:
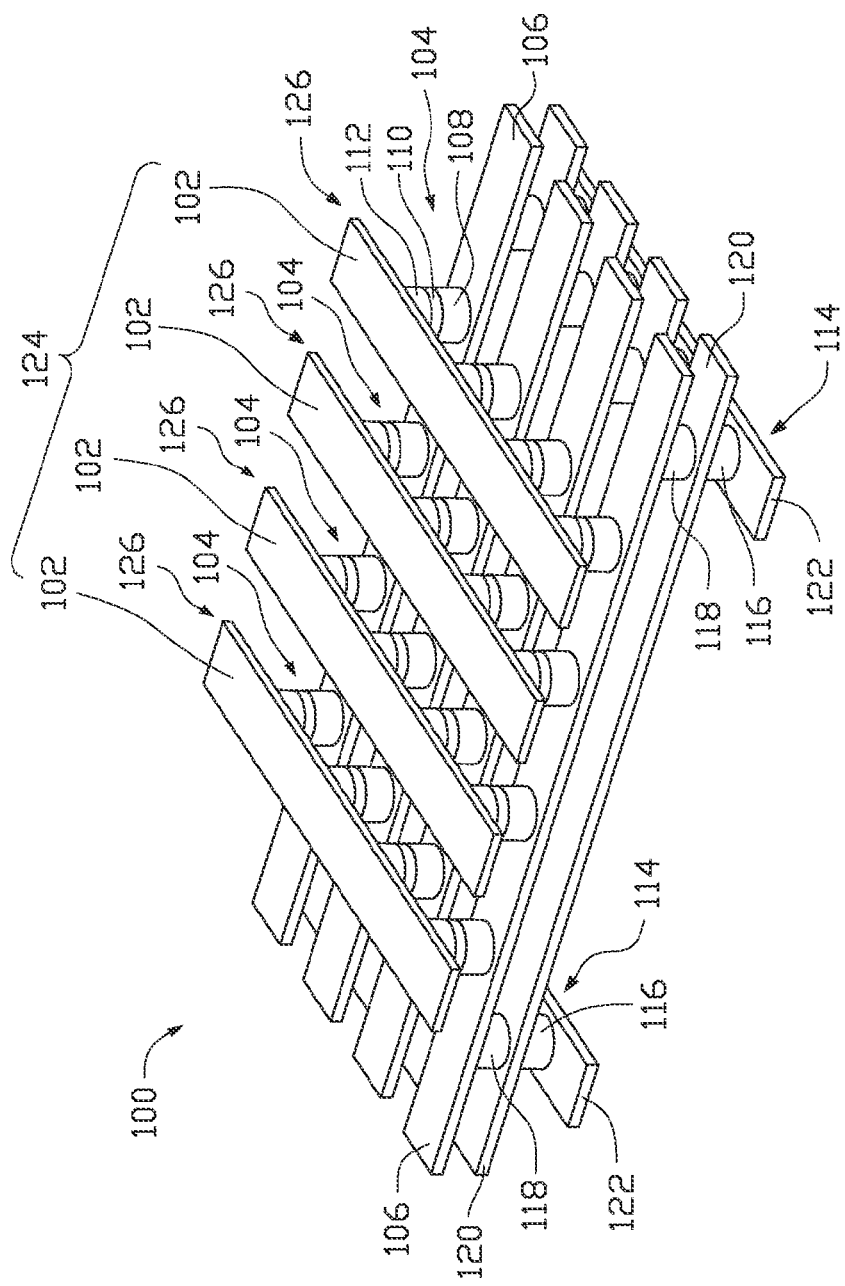
FIG. 1 is a schematic diagram of a memory cell array according to one embodiment described herein.

FIG. 1 is a schematic diagram of a memory cell array 100 according to one embodiment described herein. The memory cell array 100 may be a portion of a SHE-MRAM device. The memory cell array 100 may include a plurality of first leads 102, a plurality of second leads 106, and a plurality of memory cells 104. The plurality of first leads 102 may be substantially parallel among each other, the plurality of second leads 106 may be substantially parallel among each other, and each first lead 102 may be substantially perpendicular to each second lead 106. The plurality of first leads 102 may be disposed over the plurality of second leads 106, and each memory cell 104 may be disposed between a first lead 102 and a second lead 106. Each first lead 102 may be made of a conductive metal, such as copper. Each second lead 106 may be made of a material having large spin orbit interactions, such as beta phase platinum (β-Pt), beta phase tungsten (β-W), or beta phase tantalum (β-Ta). The material having large spin orbit interactions has high electrical resistivity compared to conductive metals. Each second lead 106 may be very thin, such as about 10 to 100 Angstroms. Each memory cell 104 of the plurality of memory cells 104 is disposed between a first lead 102 and a second lead 106 at a location that the first lead 102 and the second lead 106 cross over or intersect. Each memory cell 104 may be in contact with a first lead 102 and a second lead 106. Four first leads 102 and four second leads 106 are illustrated in FIG. 1, but the memory cell array 100 may include more than four first leads 102 and second leads 106, such as 4,000 first leads 102 and 4,000 second leads 106. Similarly, 16 memory cells 104 are illustrated in FIG. 1, but the memory cell array 100 may include more than 16 memory cells, such as 16,000,000 memory cells (4,000 memory cells coupled to each second lead 106 and there are 4,000 second leads 106).

Each memory cell 104 may be a MTJ stack and include a free layer 108, a barrier layer 110, and a reference layer 112. The free layer 108 may be disposed on and in contact with the second lead 106, as shown in FIG. 1. Alternatively, layers such as seeding layer and/or antiferromagnetic layer may be disposed between the free layer 108 and the second lead 106. The free layer 108 may be made of a ferromagnetic material, such as Fe, Ni, Co, or an alloy of a ferromagnetic material, such as NiFe, CoFe, or CoFeB. The barrier layer 110 may be disposed on and in contact with the free layer 108. The barrier layer 110 may be made of a nonmagnetic metal such as Cu or Ag, or an insulating material such as alumina, MgO, or HfO. The reference layer 112 may be disposed on and in contact with the barrier layer 110. The reference layer 112 may be made of a ferromagnetic material, such as Fe, Ni, Co, or an alloy of a ferromagnetic material, such as NiFe, CoFe, or CoFeB. The first lead 102 may be disposed on and in contact with the reference layer 112 of each memory cell 104. Alternatively, a capping layer may be disposed between the first lead 102 and the reference layer 112 of each memory cell 104.

At least two transistors 114 may be electrically coupled to each second lead 106, as shown in FIG. 1. Each transistor 114 may include a first region 116, a second region 118, and an electrode 120. The electrode 120 may be a gate electrode 120. The transistors 114 may be NMOS transistors. In one embodiment, the first region 116 is a source region and the second region 118 is a drain region. In another embodiment, the first region 116 is a drain region and the second region 118 is a source region. A plurality of memory cells 104 disposed on a second lead 106 may be between two transistors 114 in contacting with the second lead 106. The electrode 120 may be shared by all of the transistors 114 coupled to one second lead 106. In other words, for each second lead 106, there is an electrode 120 that is a part of a plurality of transistors 114 coupled to the second lead 106. The electrode 120 may be substantially parallel to the lead 106 to which the electrode 120 is electrically coupled. Each transistor 114 coupled to a second lead 106 may be aligned with an adjacent transistor 114 that is coupled to another second lead 106 that is adjacent to the second lead 106, forming a column of transistors 114 (column is defined by the longitudinal direction of the first lead 102). The columns of transistors 114 may be connected to each other by a plurality of electrodes 120. As shown in FIG. 1, there are at least of two columns of transistors 114. Each column of transistors 114 may be coupled to a third lead 122. Each third lead 122 may be substantially perpendicular to the electrode 120 and substantially parallel to the first lead 102. The third lead 122 may be made of a metal, such as tungsten or titanium. The third lead 122 may be a conductive doped region in a semiconductor substrate. The columns of transistors 114 are utilized to divide the memory cell array 100 into one or more column groups 124 of memory cells 104. In one embodiment, four columns 126 of memory cells 104 are in a column group 124, as shown in FIG. 1. The memory cell array 100 may include multiple column groups 124. Each column group 124 may include at least two columns 126, such as 10 to 20 columns 126, of memory cells 104 disposed between adjacent columns of transistors 114. In other words, there may be at least two memory cells 104 between two adjacent transistors 114, and the at least two memory cells 104 and the two adjacent transistors 114 are electrically coupled to each second lead 106. In one embodiment, there are 4,000 columns 126 of memory cells 104 and there are 400 column groups 124. In another embodiment, there are 4,000 columns 126 of memory cells 104 and there are 200 column groups 124.

Conventionally, in order to switch a memory cell disposed on the second lead, a current has to travel the entire length of the second lead. Since the second lead is made of a material having high electrical resistance, large voltage is applied to the second lead in order to drive the sufficient current through the entire length of the second lead. By forming multiple column groups of memory cells, such as 10 to 20 memory cells disposed on a portion of each second lead, the current only has to flow through the portion of a specific second lead. The reduced distance a current can flow through the second lead leads to reduced voltage applied to the second lead.

Figure 2A:
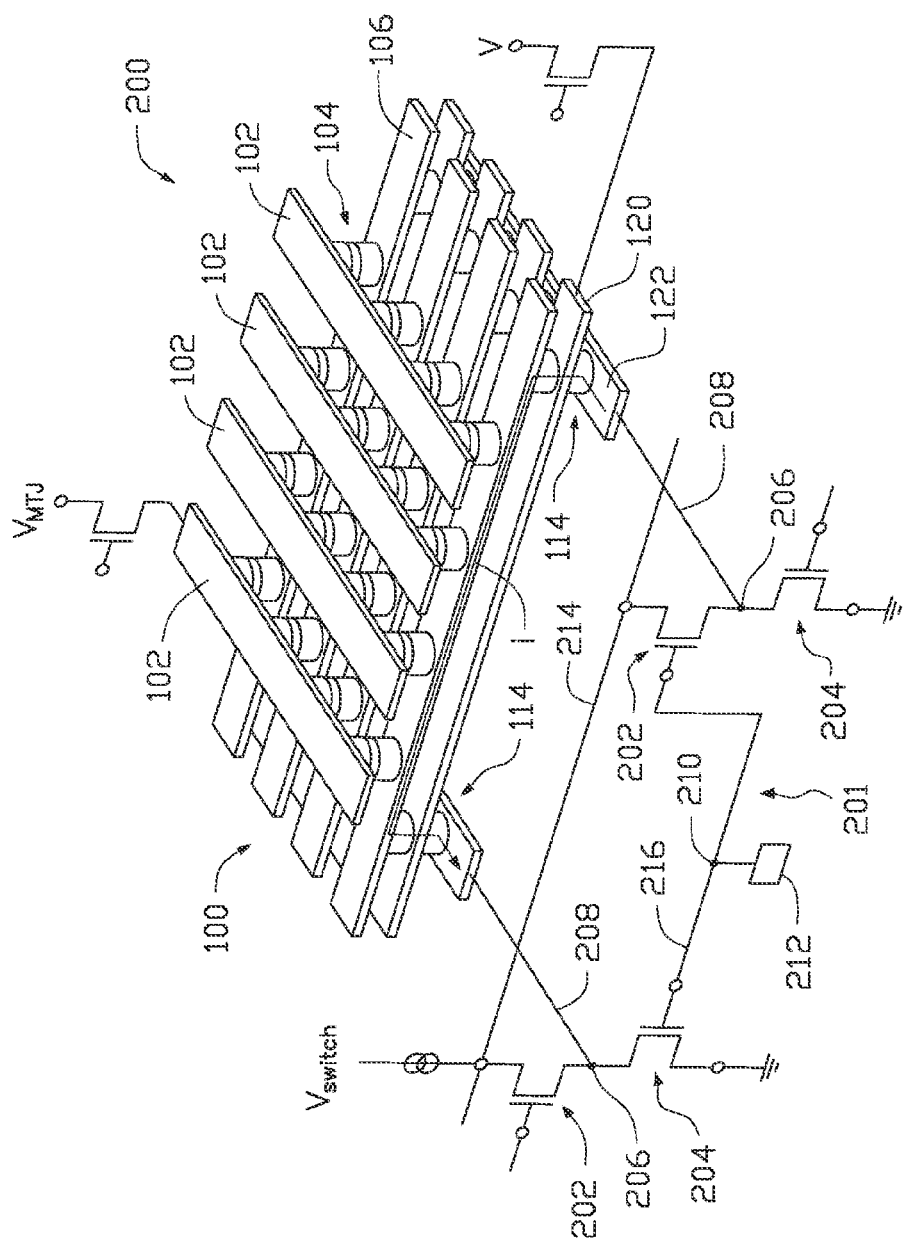
FIGS. 2A-2B are schematic diagrams of a SHE-MRAM device according to embodiments described herein.

FIG. 2A is a schematic diagram of a SHE-MRAM device 200 according to one embodiment described herein. The SHE-MRAM device 200 includes the memory cell array 100 and a periphery circuitry 201. The periphery circuitry 201 may be located on a side of the memory cell array 100 or below the memory cell array 100. Because the periphery circuitry 201 is not disposed inside of the memory cell array 100, the size of the memory cell 104 of the memory cell array 100 is not affected. In one embodiment, the memory cell 104 and the surrounding space has a size of $4F^2$, where F is the minimum lithographic feature of the densest process layer. The periphery circuitry 201 may include multiple pairs of transistors 202, 204. Each pair of transistors 202, 204 may be coupled with a corresponding third lead 122 via a contact 208 at a node 206 between the transistor 202 and the transistor 204. In one embodiment, the transistor 202 is disposed on top of the transistor 204, and the transistor 204 may be grounded. In another embodiment, the transistor 202 is disposed along side of the transistor 204 in planar fashion. The transistor 202 may be a top transistor and the transistor 204 may be a bottom transistor. The transistors 202, 204 may be NMOS transistors. Each transistor 202 of a pair of transistors 202, 204 may be coupled with a transistor 202 of an adjacent pair of transistors 202, 204 via a contact 214, and each transistor 202 of a pair of transistors 202, 204 may be coupled with a transistor 204 of an adjacent pair of transistors 202, 204 via a contact 216, as shown in FIG. 2A. A control 212 may be connected to the contact 216 at a node 210. The control 212 may be utilized to turn on the transistors 202, 204 that are coupled to the contact 216.

During operation, a closed circuit is formed and the closed circuit includes a first pair of transistors 202, 204, a second pair of transistors 202, 204, a first third lead 122 coupled with the first pair of transistors 202, 204, a second third lead 122 coupled with the second pair of transistors 202, 204, a first transistor 114 coupled to the first third lead 122, a second transistor 114 coupled to the second third lead 122, and a portion of the second lead 106 between the first transistor 114 and the second transistor 114. In one embodiment, as shown in FIG. 2A, the transistor 204 of the first pair of transistors 202, 204 is coupled with the transistor 202 of the second pair of transistors 202, 204 by the contact 216. A voltage may be applied to the control 212 that is connected to the contact 216. One of the transistors 202, 204 of the first pair of transistors 202, 204 may be on, while the other of the transistors 202, 204 of the first pair of transistors 202, 204 may be off. For the second pair of the transistors 202, 204, one of the second pair of transistors 202, 204 corresponding to the transistor of the first pair of transistors 202, 204 that is on may be off, while the other of the second pair of transistors 202, 204 may be on. In one embodiment, as shown in FIG. 2A, the transistor 202 of the first pair of transistors 202, 204 is off, the transistor 204 of the first pair of transistors 202, 204 is on (by the control 212), the transistor 202 of the second pair of transistors 202, 204 is on (by the control 212), and the transistor 204 of the second pair of transistors 202, 204 is off. A voltage source applies a voltage $V_{switch}$ to the circuit, creating a current flowing to the contact 214. Since the transistor 202 of the first pair of transistors 202, 204 is off and the transistor 202 of the second pair of transistors 202, 204 is on, the current flows through the transistor 202 of the second pair of transistors 202, 204 via the contact 214. Because the transistor 204 of the second pair of transistors 202, 204 is off, the current flows to the second third lead 122 via the contact 208. A voltage V may be applied to an electrode 120 which turns on the second transistor 114 that is disposed on the second third lead 122, allowing the current, indicated by i, to flow through the second transistor 114. The current then flows through the portion of the second lead 106, reaching the first transistor 114. Since the first transistor 114 also includes the electrode 120 that has the voltage V applied thereon, the first transistor 114 is also on, allowing the current to flow through, reaching the first third lead 122. The current then reaches the node 206 via the contact 208. Again since the transistor 202 of the first pair of transistors 202, 204 is off and the transistor 204 of the first pair of transistors 202, 204 is on, the current flows through the second transistor 204 of the first pair of transistors 202, 204 to ground.

Figure 2B:
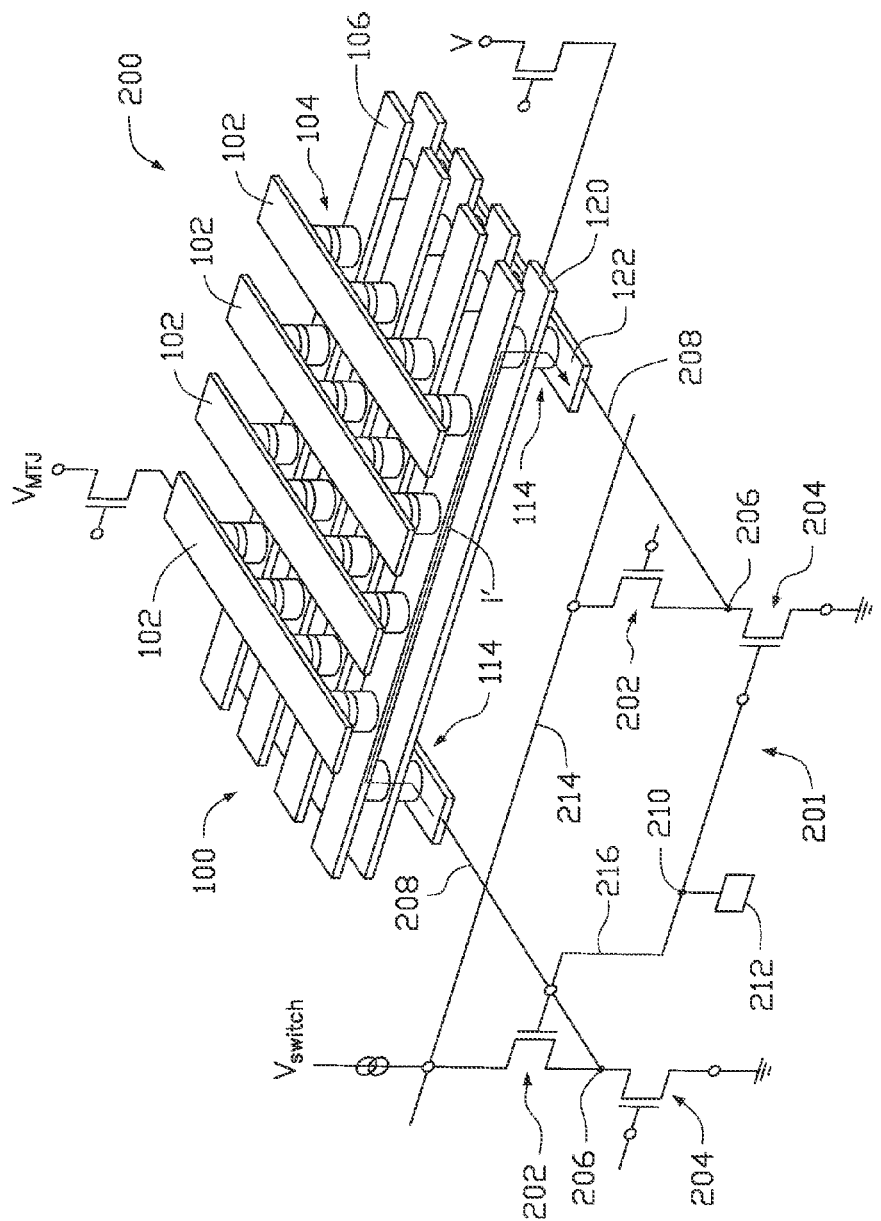

In another embodiment, as shown in FIG. 2B, the transistor 202 of the first pair of transistors 202, 204 and the transistor 204 of the second pair of transistors 202, 204 are connected by the contact 216, and a voltage may be applied to the control 212 that is connected to the contact 216. The transistor 202 of the first pair of transistors 202, 204 is on (by control 212), the transistor 204 of the first pair of transistors 202, 204 is off, the transistor 202 of the second pair of transistors 202, 204 is off, and the transistor 204 of the second pair of transistors 202, 204 is on (by control 212). A current generated by the voltage $V_{switch}$ flows through the transistor 202 of the first pair of transistors 202, 204, reaching the first third lead 122 via the contact 208. The current, indicated by i', then flows through the first transistor 114 having the electrode 120 that is turned on by the voltage V applied to the electrode 120. The current then flows through the portion of the second lead 106 (flowing in the opposite direction as the current i shown in FIG. 2A), reaching the second transistor 114, which is also turned on by the voltage V applied to the electrode 120. The current flows through the second third lead 122 and reaches the node 206 via the contact 208. The current then reaches the ground since the transistor 202 of the second pair of transistors 202, 204 is off and the transistor 204 of the second pair of transistors 202, 204 is on.

In either embodiment, the current flows through a portion of one of the second lead 106, and the portion of the second lead 106 is much shorter in length than the entire second lead 106. In one embodiment, there are 4,000 memory cells 104 disposed on one second lead 106, and the current flows through a portion of the second lead 106 on which 10 to 20 memory cells 104 are disposed thereon in order to switch one of the 10 to 20 memory cells 104. In one embodiment, a memory cell 104 is to be switched, and a voltage V is applied to a particular electrode 120 in order to switch on the plurality of transistors 114 having the electrode 120. A voltage $V_{switch}$ is applied to a periphery circuitry that is coupled to two third leads 122. The memory cell 104 to be switch is disposed between the two third leads 122. The current generated by the voltage $V_{switch}$ flows through the transistors 114 that are switched on by the voltage V and reaches a particular second lead 106, and the memory cell 104 to be switched is disposed on the particular second lead 106. A voltage $V_{MTJ}$ is applied to a particular first lead 102 which the memory cell 104 to be switched is in contact therewith. The current and the voltage $V_{MTJ}$ then causes the memory cell 104 to switch.

Figure 3:
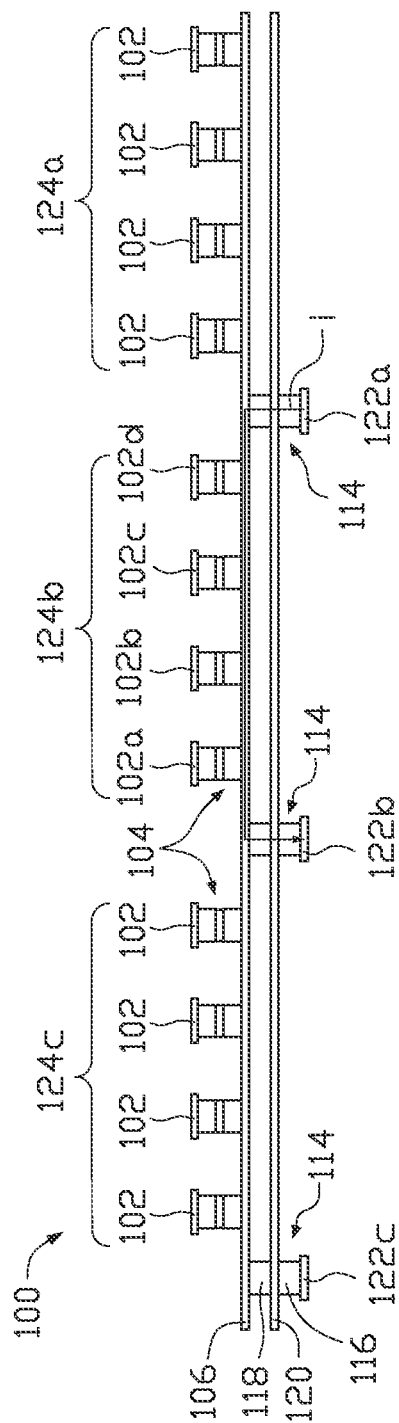
FIG. 3 is a schematic side view of the memory cell array according to one embodiment described herein.

FIG. 3 is a schematic side view of the memory cell array 100 according to one embodiment described herein. The periphery circuitry 201 is omitted for better illustration of the memory cell array 100. As shown in FIG. 3, the memory cell array 100 includes column groups 124a, 124b, 124c, and column group 124b includes first leads 102a, 102b, 102c, 102d. During operation, a current, indicated by i, generated by the voltage $V_{switch}$ (FIGS. 2A, 2B) is flowed to a third lead 122a. The current then flows to a particular second lead 106 via a transistor 114. The transistor 114 is turned on by the voltage V (FIGS. 2A, 2B). The current then flows towards a particular column group 124b, since the adjacent column group 124a is floating. The current flows through a portion of the particular second lead 106 and then reaches a third lead 122b that is adjacent the third lead 122a via a transistor 114. The column group 124c may also be floating so the current does not flow to another portion of the particular second lead 106 on which the column group 124c is disposed, and the current does not reach a third lead 122c. The column group 124b may include a plurality of memory cells 104 disposed on the portion of the particular second lead 106. In one embodiment, there are four memory cells 104 in the column group 124b, as shown in FIG. 3. In other embodiments, the number of memory cells 104 in the column group 124b may be greater or less than four. In one embodiment, the number of memory cells 104 in the column group 124b may range from 10 to 20. When applying the voltage $V_{MTJ}$ (FIGS. 2A, 2B) to a particular first lead, for example first lead 102a, the memory cell 104 disposed between the first lead 102a and the particular second lead 106 is switched by the current and the voltage $V_{MTJ}$. Again the current is controlled by the pairs of transistors of the periphery circuitry (FIGS. 2A, 2B).

In summary, a SHE-MRAM device including a memory cell array including a plurality of first leads, a plurality of second leads, a plurality of memory cells, and at least two columns of transistors that are utilized to divide the memory cell array into column groups. Each column of transistors is coupled to a third lead and each third lead is coupled to a periphery circuitry that is disposed on a side of the memory cell array or under the memory cell array. The periphery circuitry includes multiple pairs of transistors, and each pair of transistors is coupled with a third lead of the memory cell array. The pairs of transistors are utilized to allow a current to flow through a portion of one of the second lead, which is made of material having high electrical resistance. By reducing the distance the current is flowing through the second lead, applying excessive voltage to drive a sufficient current is avoided.

While the foregoing is directed to embodiments of the disclosure, other and further embodiments may be devised without departing from the basic scope thereof, and the scope thereof is determined by the claims that follow.

What is claimed is:

1. A memory, comprising:
   a plurality of first leads;
   a plurality of transistors coupled to a second lead, the transistors configured to divide the second lead into a plurality of sections, each section comprising a portion of the second lead between transistors coupled at adjacent locations along the second lead; and
   a plurality of memory cell groups, each group comprising memory cells disposed between a respective section of the second lead and one or more of the first leads.

2. The memory of claim 1, wherein each memory cell comprises:
   a ferromagnetic free layer;
   a barrier layer disposed on and in contact with the ferromagnetic free layer; and
   a ferromagnetic reference layer disposed on and in contact with the barrier layer.

3. The memory of claim 2, wherein the ferromagnetic free layer is disposed on and in contact with the second lead.

4. The memory of claim 1, wherein the second lead comprises a material selected from the group consisting of beta phase platinum (β-Pt), beta phase tungsten (β-W), and beta phase tantalum (β-Ta).

5. The memory of claim 1, further comprising a plurality of third leads, wherein each of the transistors is coupled to one of the third leads.

6. The memory of claim 5, wherein the third leads comprise a material selected from the group consisting of tungsten and titanium.

7. The memory of claim 1, wherein the transistors are coupled to periphery circuitry configured to drive a current between transistors coupled at adjacent locations along the second lead.

8. A memory device, comprising:
   a plurality of first leads;
   a second lead;
   a plurality of memory cells disposed between the plurality of first leads and the second lead; and
   a plurality of transistor pairs configured to divide the plurality of memory cells into a plurality of groups, wherein transistors of the transistor pairs are positioned on the second lead such that a current flowing between transistors of a first transistor pair passes through a portion of the second lead corresponding to a first group without passing through portions of the second lead corresponding to one or more other groups.

9. The memory device of claim 8, further comprising a plurality of third leads, wherein each transistor of the transistor pairs is coupled to one of the third leads.

10. The memory device of claim 9, wherein the third leads comprise a material selected from the group consisting of tungsten and titanium.

11. The memory device of claim 9, wherein the third leads are coupled to periphery circuitry configured to drive a current between transistors of the transistor pairs.

12. The memory device of claim 8, wherein the second lead comprises a material selected from the group consisting of beta phase platinum (β-Pt), beta phase tungsten (β-W), and beta phase tantalum (β-Ta).

13. A Spin Hall Effect magnetoresistive random access memory (SHE-MRAM) device, comprising:
    a memory cell array, wherein the memory cell array comprises:
      a plurality of first leads;
      a plurality of second leads;
      a plurality of memory cells disposed between the plurality of first leads and the plurality of second leads; and
      at least two columns of transistors, wherein the at least two columns of transistors divide the plurality of memory cells into one or more column groups of memory cells; and
    at least two pairs of transistors, wherein each pair of transistors of the at least two pairs of transistors is coupled with a column of transistors of the at least two columns of transistors.

14. The SHE-MRAIVI device of claim 13, wherein the memory cell array further comprises at least two third leads, wherein each column of the at least two columns of transistors is coupled to a third lead of the at least two third leads.

15. The SHE-MRAIVI device of claim 14, wherein the at least two third leads each comprises tungsten or titanium.

16. The SHE-MRAIVI device of claim 13, wherein the plurality of second leads each comprises a material selected from the group consisting of beta phase platinum (β-Pt), beta phase tungsten (β-W), and beta phase tantalum (β-Ta).

17. The SHE-MRAIVI device of claim 13, wherein the at least two columns of transistors comprises at least two transistors coupled to a second lead of the plurality of second leads.

18. The SHE-MRAIVI device of claim 13, wherein the at least two pairs of transistors share an electrode.

19. A Spin Hall Effect magnetoresistive random access memory (SHE-MRAM) device, comprising:
  a memory cell array, wherein the memory cell array comprises:
    a plurality of memory cells; and
    at least two columns of transistors, wherein the at least two columns of transistors divide the plurality of memory cells into one or more column groups of memory cells; and
  at least two pairs of transistors, wherein each pair of transistors of the at least two pairs is coupled with a column of transistors of the at least two columns of transistors, wherein each pair of transistors comprises a top transistor and a bottom transistor, and the bottom transistor is grounded.

20. The SHE-MRAIVI device of claim 19, wherein the memory cell array further comprises a plurality of first leads and a plurality of second leads, wherein the plurality of memory cells are disposed between the plurality of first leads and the plurality of second leads.

21. The SHE-MRAIVI device of claim 20, wherein the at least two columns of transistors comprises at least two transistors disposed on the plurality of second leads, and wherein the at least two transistors disposed on each second lead of the plurality of second leads share an electrode.

22. The SHE-MRAIVI device of claim 21, further comprising at least two third leads, wherein each third lead is coupled to each column of transistors of the at least two columns of transistors.

23. The memory of claim 1, wherein:
  the plurality of transistors comprise a first transistor and a second transistor, and
  the first transistor and the second transistor comprise a same gate electrode.

24. The memory of claim 1, wherein:
  the memory cells comprise magnetoresistive memory cells, and
  a switching current flowing between a first adjacent pair of the plurality of transistors passes through a first section of the second lead without passing through one or more other sections of the second lead.

* * * * *